(12) United States Patent
Hou et al.

(10) Patent No.: US 10,356,909 B1
(45) Date of Patent: Jul. 16, 2019

(54) EMBEDDED CIRCUIT BOARD AND METHOD OF MAKING SAME

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Ning Hou, Shenzhen (CN); Biao Li, Shenzhen (CN); Hao-Wen Zhong, Shenzhen (CN); Ming-Hui Wang, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 16/147,593

(22) Filed: Sep. 29, 2018

(30) Foreign Application Priority Data

Jul. 24, 2018 (CN) .......................... 2018 1 0821278

(51) Int. Cl.
*H05K 1/18* (2006.01)
*H05K 3/00* (2006.01)
*H05K 3/34* (2006.01)
*H05K 3/46* (2006.01)

(52) U.S. Cl.
CPC ............ *H05K 1/185* (2013.01); *H05K 1/189* (2013.01); *H05K 3/007* (2013.01); *H05K 3/0058* (2013.01); *H05K 3/3452* (2013.01); *H05K 3/4697* (2013.01)

(58) Field of Classification Search
CPC .... H05K 1/185; H05K 3/4697; H05K 3/0058; H05K 3/007; H05K 1/189; H05K 3/3452
USPC .......................................... 174/250
See application file for complete search history.

(56) References Cited

U.S. PATENT DOCUMENTS

| | | | |
|---|---|---|---|
| 2015/0144386 A1* | 5/2015 | Kim ........ | H05K 1/186 174/260 |
| 2016/0165733 A1* | 6/2016 | Kim ........ | H05K 1/186 174/260 |
| 2018/0153036 A1* | 5/2018 | Wu ........ | H05K 1/111 |

* cited by examiner

*Primary Examiner* — Sherman Ng
(74) *Attorney, Agent, or Firm* — ScienBiziP, P.C.

(57) ABSTRACT

An embedded circuit board includes a flexible printed circuit board, a component, a conductive material, two adhesive layers, and two substrates. The flexible printed circuit board defines at least one cavity passing through the flexible printed circuit board. The flexible printed circuit board includes a base layer, a first conductive circuit layer formed on at least one surface of the base layer, and a protective layer formed on both sides of the base layer. The base layer and the first conductive circuit layer protrude into the cavity. The component is received within the cavity and abuts against the first conductive circuit layer protruding into the cavity. The conductive material is applied in a gap between the component and the first conductive circuit layer. The two substrates are adhered to the flexible printed circuit board by the two adhesive layers.

12 Claims, 6 Drawing Sheets

EMBEDDED CIRCUIT BOARD AND METHOD OF MAKING SAME

FIELD

The subject matter herein generally relates to circuit boards, and more particularly to an embedded circuit board having a component embedded therein.

BACKGROUND

Generally, circuit boards are electrically coupled to external components for controlling functions of the external components. The external components usually take up the limited available space of an electronic device.

Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
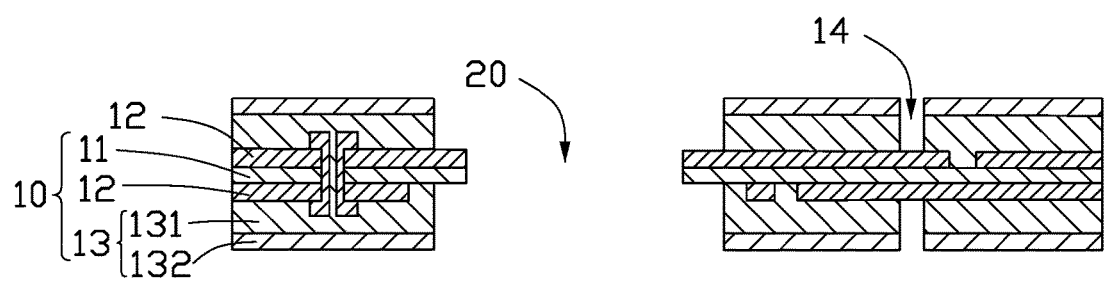
FIG. 1 is a cross-sectional view of an embodiment of a flexible printed circuit board.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIGS. 1-6 illustrate an embodiment of a method of making an embedded circuit board 100 including a component 90 embedded therein.

Referring to FIG. 1, at step S1, a flexible printed circuit board 10 is provided. The flexible printed circuit board 10 defines at least one cavity 20 passing through the flexible printed circuit board 10.

The flexible printed circuit board 10 includes a flexible substrate base layer 11, two conductive circuit layers 12 formed on each of the opposite sides of the base layer 11, the first conductive circuit layers 12 electrically coupled together, and two protective layers 13, one of each of the two protective layers 13 formed on one of the first conductive circuit layers 12. The cavity 20 is defined through each protective layer 13, first conductive circuit layer 12, and the base layer 11. The base layer 11 and one of the first conductive circuit layers 12 extend partially into the cavity 12 from each side of the cavity 12. A length of the extending portions of the base layer 11 and the first conductive circuit layer 12 on each side of the cavity 12 is about 100 micrometers to about 10 millimeters.

Material of the base layer 11 may be selected from one of polyimide, liquid crystal polymer, polyether-ether-ketone, polyethylene terephthalate, and polyethylene naphthalate.

The first conductive circuit layer 12 is made of copper, silver, tin, gold, or any other conductive material.

The protective layers 13 fill in a gap between the first conductive circuit layers 12 and the base layer 11. In at least one embodiment, the protective layer 13 includes an insulating layer 131 and a second protective layer 132. The insulating layer 131 covers a surface of the first conductive circuit layer 12 away from the base layer 11 and fills in a gap between the first conductive circuit layer 12 and the base layer 11. The insulating layer 131 is made of flexible insulating material. In at least one embodiment, the insulating layer 131 is made of resin, such as epoxy resin. In detail, in manufacture, the insulating layer 131 is partially solidified, so that the insulating layer 131 does not run off but is easily deformed, and is applied on the surface of the first conductive circuit layers 12 away from the base layer 11. The partially solidified insulating layer 131 applied on the first conductive circuit layers 12 is pressed to cause the insulating layer 131 to fill in the gap between the first conductive circuit layer 12 and the base layer 11. The second protective layer 132 is formed on a surface of the insulating layer 131 away from the first conductive circuit layer 12. The second protective layer 132 may be a solder mask or a cover layer, such as CVL.

It should be understood that, before the second protective layer 132 is formed, a plurality of additional conductive circuit layers (not shown) may be formed on a surface of the insulating layer and electrically coupled to the first conductive circuit layer 12 to create a multi-layered conductive flexible printed circuit board 10.

A width of the cavity 20 is greater than a width of the component 90. A width between the portion of the base layer 11 and the first conductive circuit layer 12 extending from one side of the cavity 20 and the portion of the base layer 11 and the first conductive circuit layer 12 extending from an opposite side of the cavity 20 is less than the width of the component 90. In at least one embodiment, the cavity 20 is defined by punch pressing. In another embodiment, the cavity 20 is defined by another method, such as by machine-cutting, laser cutting, or the like.

In at least one embodiment, the flexible printed circuit board 10 further includes two oppositely defined vias 14.

Each via 14 is defined in a corresponding one of the protective layers 13 to reveal the corresponding first conductive circuit layer 12.

Figure 2:
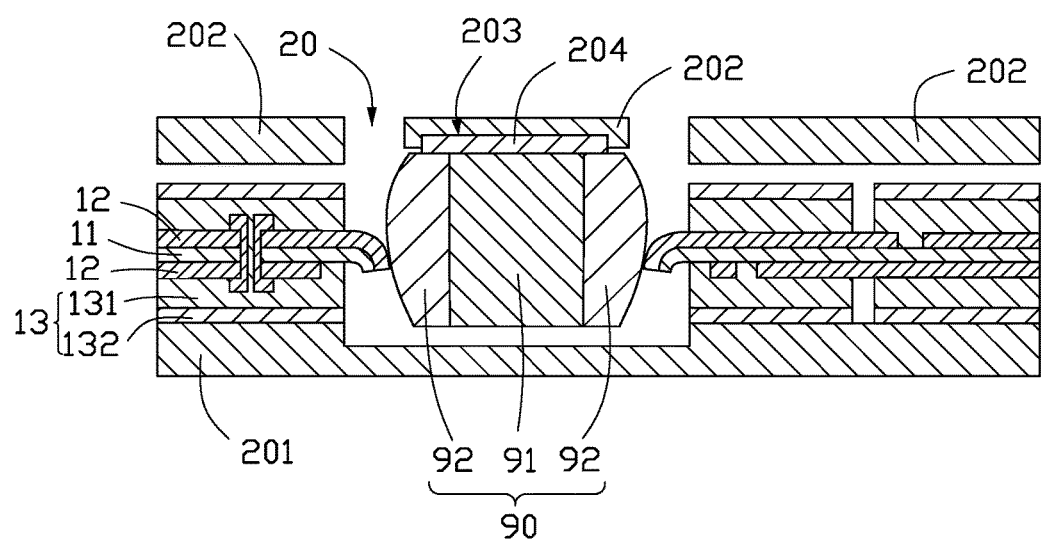
FIG. 2 is a cross-sectional view of the flexible printed circuit board of FIG. 1 placed within a fixture including a component.

FIG. 2 shows, in step S2, a fixture (not labeled) including the component 90 is provided, the flexible printed circuit board 10 (shown in FIG. 1) is placed within the fixture, and the fixture and the flexible printed circuit board 10 are laminated together. The fixture includes a lower fixture 201 and an upper fixture 202. A lower protective layer 13 of the flexible printed circuit board 10 is placed on the lower fixture 201. In at least one embodiment, a surface of the upper fixture 202 facing the cavity 20 has a pre-fixing material 204 applied thereon to fix the component 90 thereto. In detail, the upper fixture 202 defines a pre-fixing groove 203. The pre-fixing material 204 is applied in the pre-fixing groove 203 to fix the component 90 thereto. The pre-fixing material 204 may be a thermosetting adhesive, a light-setting adhesive, or other curable material. In another embodiment, the component 90 can be fixed to a surface of the lower fixture 201 facing the cavity 20.

The component 90 includes a base body 91 and a connection circuit 92 formed on opposite sides of the base body 91. The base body 91 is fixed in the pre-fixing groove 203 by the pre-fixing material 204. The connection circuits 92 formed on opposite sides of the component 90 abut against the first conductive circuit layer 12 extending into the cavity 20, thereby causing the base layer 11 and the first conductive circuit layer 12 extending into the cavity 20 to bend and electrically coupling the two connection circuits 92 to a corresponding one of the first conductive circuit layers 12. A length of the curved portion of the base layer 11 and the first conductive circuit layer 12 is between about ten micrometers to about a few hundred micrometers, and the length of the curved portion of the base layer 11 and the first conductive circuit layer 12 is less than the lengths of a portion of the base layer 11 and the first conductive circuit layer 12 extending into the cavity 20.

Figure 3:
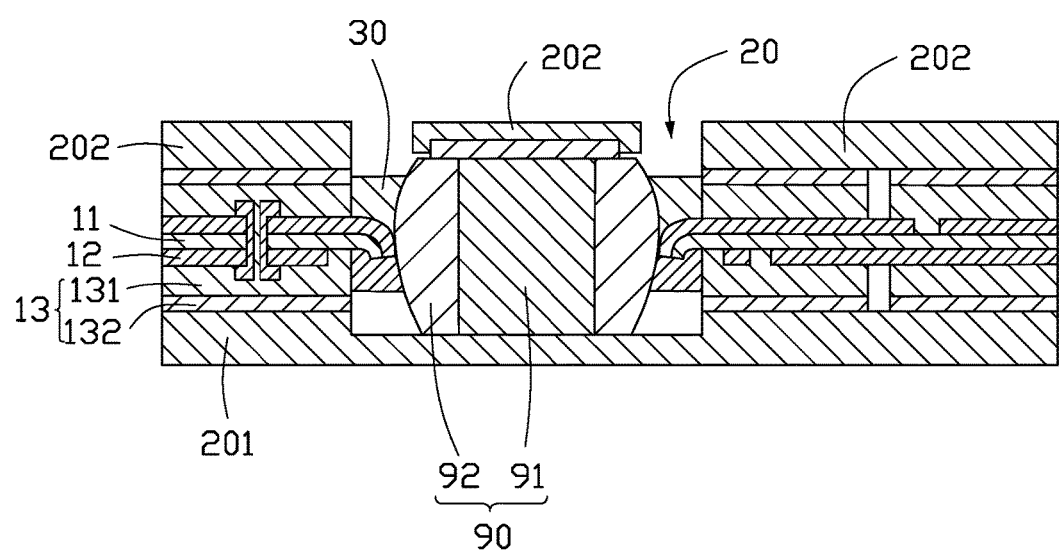
FIG. 3 is a cross-sectional view of the flexible printed circuit board and the component of FIG. 2 laminated together with conductive material.

Referring to FIG. 3, in step S3, conductive material 30 is applied within the cavity 20 in a gap between the component 90 and the first conductive circuit layer 12 and then solidified. In at least one embodiment, the conductive material 30 is solder paste solidified by reflow curing.

In at least one embodiment, after the component 90 and the first conductive circuit layer 12 are electrically coupled by the conductive material 30, a contact point at a junction within the cavity 20 between the component 90 and the base layer 11 and first conductive circuit layer 12 are spot-dispensed thereon.

In step S4, the fixture and the flexible printed circuit board 10 are heated to soften the pre-fixing material 204 in order to peel off the fixture from the component 90 and remove the fixture. A temperature of heating is less than a melting temperature of the conductive material 30.

Figure 4:
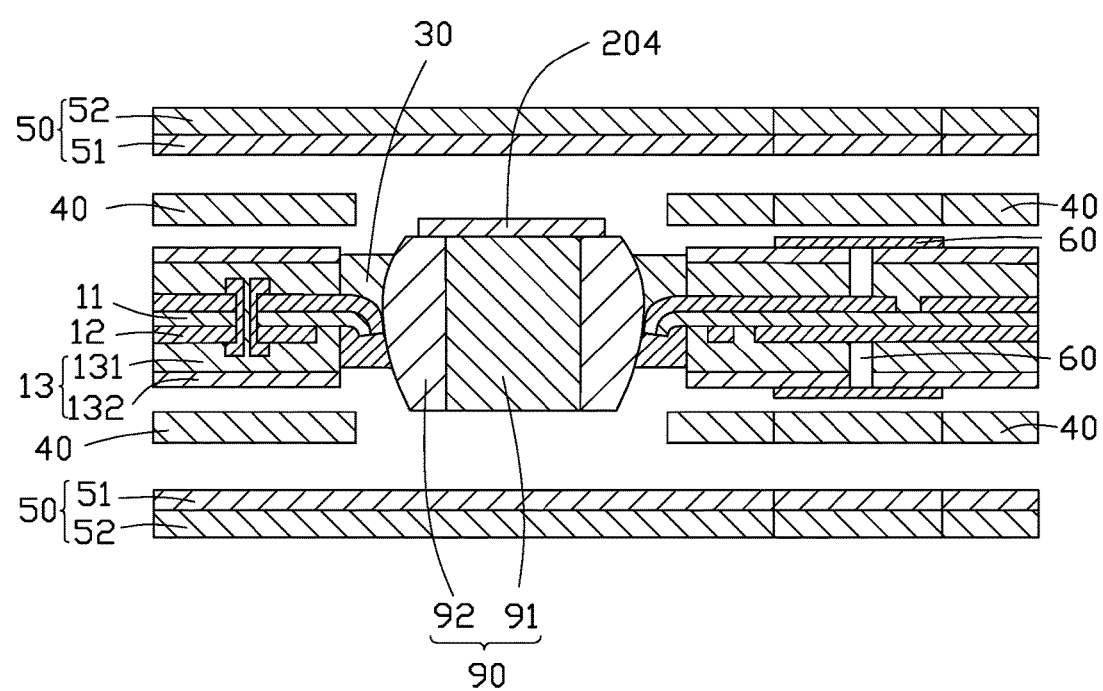
FIG. 4 is a cross-sectional view of FIG. 3 showing a step of applying a colloid and a substrate.

Referring to FIG. 4, in step S5, a colloid 40 is applied on an outer surface of each protective layer 13, and a substrate 50 is applied on an outer surface of the colloid 40. In at least one embodiment, a peelable adhesive 60 is applied on a surface of the flexible printed circuit board 10 (shown in FIG. 1) adjacent to the vias 14. In at least one embodiment, the colloid 40 is made of an adhesive resin. In detail, the resin is selected from at least one of polypropylene, epoxy resin, polyurethane, phenolic resin, urea resin, melamine-formaldehyde resin, and polyimide. The substrate 50 is copper clad laminate. The substrate 50 includes an FR-4 epoxy glass cloth substrate 51 and a copper layer 52.

Figure 5:
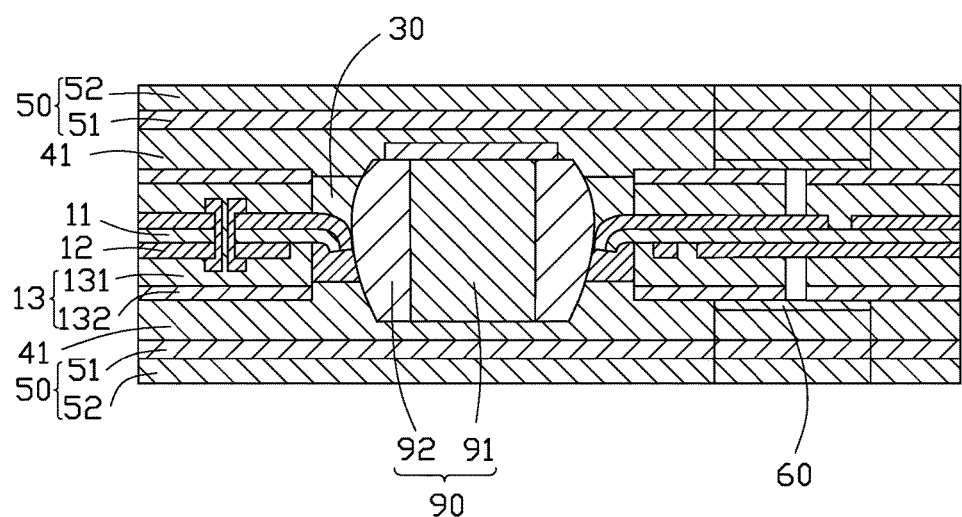
FIG. 5 is a cross-sectional view of FIG. 4 with the colloid and the substrate laminated together.

Referring to FIG. 5, in step S6, the substrate 50, the colloid 40, and the flexible printed circuit board 10 (shown in FIG. 1) are laminated together. The colloid 40, by being heated and pressed, flows and forms an adhesive layer 41 to adhere the substrate 50, the flexible printed circuit board 10, and the component 90.

Figure 6:
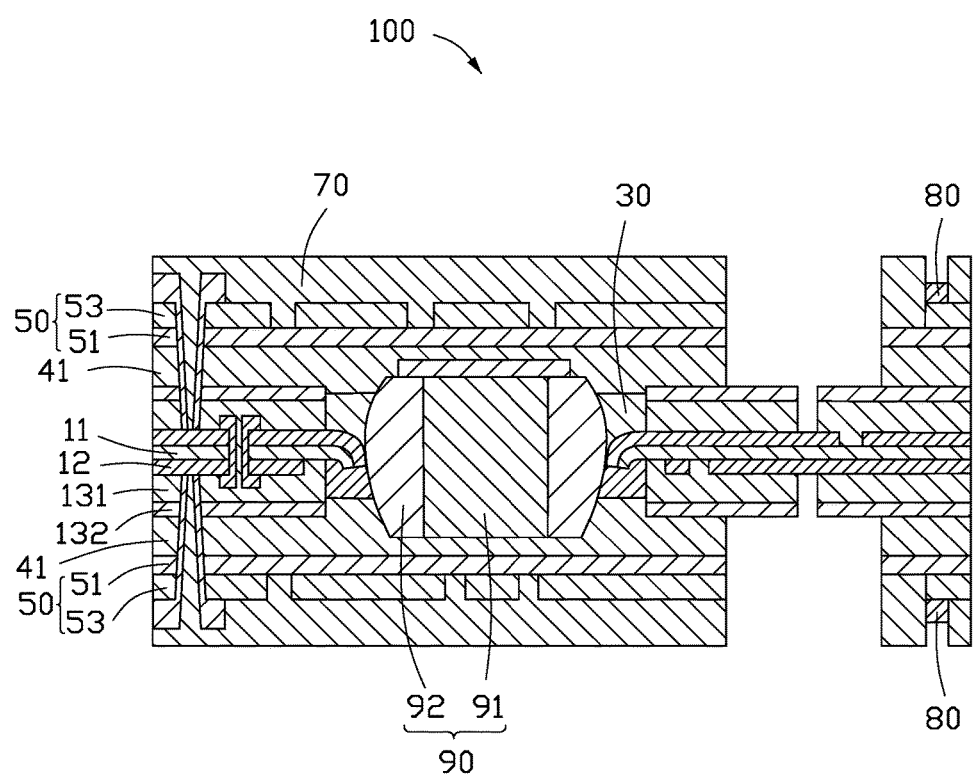
FIG. 6 is a cross-sectional view of FIG. 5 showing further processing to obtain an embedded circuit board.

Referring to FIG. 6, in step S7, the circuit board is surface-treated by etching, solder masking, and electroless nickel immersion gold processing. The copper layer 52 forms a second conductive circuit layer 53 after being etched. A solder mask layer 70 is formed by spraying solder resist ink. In at least one embodiment, electroless nickel immersion gold processing is utilized to form a metal layer 80 on a surface of the solder mask layer 70. In another embodiment, electrogilding, electroless tin plating, electro-tinning, or other methods may be used to form the metal layer 80. In at least one embodiment, the vias 14 are uncovered.

Referring to FIG. 6, in at least one embodiment, the embedded circuit board 100 includes the flexible printed circuit board 10 (shown in FIG. 1), the component 90 located within the flexible printed circuit board 10, the two substrates 50 adhered by the adhesive layer 41 to the two sides of the flexible printed circuit board 10, and the two solder mask layers 70 and the two metal layers 80 applied on an outer side of the substrate 50 for protecting the circuit board.

The flexible printed circuit board 10 includes a flexible substrate base layer 11, a first conductive circuit layer 12 formed on opposite sides of the base layer 11, the first conductive circuit layers 12 electrically coupled together, and two protective layers 13 each formed on a corresponding one of the first conductive circuit layers 12.

The flexible printed circuit board 10 defines at least one cavity 20. The component 90 is received within the cavity 20. The component 90 includes a base body 91 and a connection circuit 92 formed on each of opposite sides of the base body 91. The connection circuits 92 each abut against a corresponding one of the first conductive circuit layers 12 protruding into the cavity 20 to electrically coupled to the first conductive circuit layer 12. The connection circuit 92 and the first conductive circuit layer 12 are electrically coupled together by the reflow curing conductive material 30.

The substrate 50 includes the FR-4 epoxy glass cloth substrate 51 and the second conductive circuit layer 53.

The embedded circuit board 100 of the present disclosure includes the flexible printed circuit board 10 defining the cavity 20. The first conductive circuit layer 12 extends into the cavity 20. When the component 90 is received within the cavity 20, a side of the component 90 abuts against a portion of the first conductive circuit layer 12 extending into the cavity 20. The conductive material 30 fixes the component 90 to the flexible printed circuit board 10. Thus, the component 90 does not need to be adhered to an outer surface of the circuit board, thereby improving a circuit configuration and reducing a thickness of the circuit board.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of making an embedded circuit board, the method comprising:

provided a flexible printed circuit board defining at least one cavity passing through the flexible printed circuit board, the flexible printed circuit board comprising a base layer, a first conductive circuit layer formed on at least one surface of the base layer, and a protective layer formed on each peripheral side of the flexible printed circuit board, the base layer and the first conductive circuit layer protruding into the cavity;

providing a fixture comprising a component and placing the flexible printed circuit board within the fixture to receive the component within the mounting slot to abut a side of the component against the first conductive circuit layer;

applying conductive material in a gap between the component and the first conductive circuit layer and solidifying the conductive material;

removing the fixture;

applying a colloid on an outer surface of each protective layer and placing a substrate on an outer surface of the colloid; and laminating the substrate, the colloid, and the flexible printed circuit board together.

2. The method of claim 1, wherein when the component is received within the cavity, the base layer and the first conductive circuit layer are bent by pressing.

3. The method of claim 2, wherein a length of a bent portion of the base layer and the first conductive circuit layer is less than a length of portions of the base layer and the first conductive circuit layer protruding into the cavity.

4. The method of claim 1, wherein the component is fixed to the fixture by a pre-fixing material; the fixture is removed by heating the fixture and the flexible printed circuit board to solidify the pre-fixing material to allow peeling off the fixture.

5. The method of claim 1, wherein after the substrate, the colloid, and the flexible printed circuit board are laminated together, the substrate is surface-treated by etching, solder masking, and electroless nickel immersion gold processing.

6. The method of claim 1, wherein the colloid, after being heated and pressed adheres the substrate, the flexible printed circuit board, and the component together.

7. An embedded circuit board comprising:

a flexible printed circuit board defining at least one cavity passing through the flexible printed circuit board, the flexible printed circuit board comprising a base layer, a first conductive circuit layer formed on at least one surface of the base layer, and a protective layer formed on both sides of the base layer, the base layer and the first conductive circuit layer protruding into the cavity;

a component received within the cavity and abutting against the first conductive circuit layer protruding into the cavity;

conductive material applied in a gap between the component and the first conductive circuit layer;

two adhesive layers; and two substrates adhered to the flexible printed circuit board by the two adhesive layers.

8. The embedded circuit board of claim 7, wherein the adhesive layers are located in a gap between the flexible printed circuit board and the component.

9. The embedded circuit board of claim 7, wherein the substrate comprises: an epoxy glass cloth substrate adhered to the adhesive layer; and a second conductive circuit layer formed on a surface of the epoxy glass cloth substrate away from the adhesive layer.

10. The embedded circuit board of claim 7, further comprising: a solder mask layer formed on a surface of the substrate away from the flexible 15 printed circuit board; and a metal layer formed on a surface of the solder mask layer away from the substrate.

11. The embedded circuit board of claim 7, wherein the first conductive circuit layer comprises a bent portion abutting the component.

12. The embedded circuit board of claim 10, wherein the first conductive circuit layer and the base layer comprise a bent portion; a length of the bent portion of the base layer and the first conductive circuit layer is less than a length of portions of the base layer and the first conductive circuit layer protruding into the cavity.

* * * * *